US010833376B2

(12) United States Patent
Bonhomme et al.

(10) Patent No.: US 10,833,376 B2
(45) Date of Patent: Nov. 10, 2020

(54) BATTERY WITH LIFE ESTIMATION

(71) Applicant: CPS Technology Holdings LLC, New York, NY (US)

(72) Inventors: Frederic C. Bonhomme, Thiensville, WI (US); Xugang Zhang, Milwaukee, WI (US); David R. Boone, Waukesha, WI (US)

(73) Assignee: CPS Technology Holdings LLC, New York, NY (US)

( * ) Notice: Subject to any disclaimer, the term of this patent is extended or adjusted under 35 U.S.C. 154(b) by 904 days.

(21) Appl. No.: 14/578,011

(22) Filed: Dec. 19, 2014

(65) Prior Publication Data

US 2015/0188198 A1 Jul. 2, 2015

Related U.S. Application Data

(60) Provisional application No. 61/923,121, filed on Jan. 2, 2014.

(51) Int. Cl.
*H01M 10/48* (2006.01)
*G01L 1/00* (2006.01)
(Continued)

(52) U.S. Cl.
CPC ............. *H01M 10/48* (2013.01); *B60L 50/64* (2019.02); *B60L 58/12* (2019.02); *B60L 58/16* (2019.02);
(Continued)

(58) Field of Classification Search
CPC .............. B60L 11/1857; B60L 11/1861; B60L 11/1879; B60L 2250/16; B60L 2270/145; B60L 50/64; B60L 58/12; B60L 58/16; G01L 1/00; G01R 31/36; G01R 31/3606; G01R 31/3644; G01R 31/382; G01R 31/392; H01M 10/0525; H01M 10/4207;
(Continued)

(56) References Cited

U.S. PATENT DOCUMENTS 5,281,495 A 1/1994 Hirakawa et al.
2004/0076872 A1* 4/2004 Kinoshita ........... B60L 11/1861
429/61

(Continued)

FOREIGN PATENT DOCUMENTS

JP 2006185707 A * 7/2006
JP 2012033328 2/2012

(Continued)

OTHER PUBLICATIONS

Machine translation of JP 2006-185707 (Year: 2019).*
International Search Report & Written Opinion for International Application No. PCT/US2014/072632 dated Mar. 24, 2015.

*Primary Examiner* — Lingwen R Zeng
(74) *Attorney, Agent, or Firm* — Boardman & Clark LLP (57) ABSTRACT

A battery module includes a housing. The battery module also includes a cell stack disposed in the housing and including a battery cell. The battery module also includes a force gauge in mechanical communication with the cell stack and configured to measure a force generated by a swelling of the cell stack. The battery module also includes a control module configured to receive data indicative of the force and to estimate a remaining usable life of the battery module based on the data.

20 Claims, 6 Drawing Sheets

(51) Int. Cl.
*G01R 31/36* (2020.01)
*G01R 31/382* (2019.01)
*H01M 10/0525* (2010.01)
*H01M 10/42* (2006.01)
*B60L 58/16* (2019.01)
*B60L 50/64* (2019.01)
*B60L 58/12* (2019.01)
*H01M 2/02* (2006.01)
*G01R 31/392* (2019.01)

(52) U.S. Cl.
CPC .............. *G01L 1/00* (2013.01); *G01R 31/382* (2019.01); *H01M 10/0525* (2013.01); *H01M 10/4207* (2013.01); *B60L 2250/16* (2013.01); *B60L 2270/145* (2013.01); *G01R 31/392* (2019.01); *H01M 2/0217* (2013.01); *Y02E 60/122* (2013.01); *Y02P 70/54* (2015.11); *Y02T 10/705* (2013.01); *Y02T 10/7011* (2013.01); *Y02T 10/7044* (2013.01); *Y02T 90/16* (2013.01); *Y10T 29/49108* (2015.01)

(58) Field of Classification Search
CPC ... H01M 10/48; H01M 2/0217; Y02E 60/122; Y02P 70/54; Y02T 10/7011; Y02T 10/7044; Y02T 10/705; Y02T 90/16; Y10T 29/49108
See application file for complete search history.

(56) References Cited

U.S. PATENT DOCUMENTS

| | | | |
|---|---|---|---|
| 2010/0068607 A1* | 3/2010 | Spare | H01M 10/48 429/90 |
| 2010/0304201 A1 | 12/2010 | Caumont et al. | |
| 2012/0070718 A1* | 3/2012 | Motohashi | H01M 2/0245 429/156 |
| 2012/0148890 A1* | 6/2012 | Goto | H01M 2/1077 429/90 |
| 2012/0286739 A1 | 11/2012 | O'Brien, Jr. et al. | |
| 2013/0257382 A1 | 10/2013 | Field et al. | |
| 2013/0323554 A1 | 12/2013 | Heubner et al. | |
| 2014/0255738 A1 | 9/2014 | Adams et al. | |

FOREIGN PATENT DOCUMENTS

| | | |
|---|---|---|
| JP | 2013092398 | 5/2013 |
| WO | 2014100937 | 7/2014 |

* cited by examiner

BATTERY WITH LIFE ESTIMATION

CROSS REFERENCE TO RELATED APPLICATION

This application claims priority from and the benefit of U.S. Provisional Application Ser. No. 61/923,121, entitled "BATTERY WITH LIFE ESTIMATION", filed Jan. 2, 2014, which is hereby incorporated by reference in its entirety.

BACKGROUND

The present disclosure relates generally to the field of batteries and battery modules. More specifically, the present disclosure relates to the estimation of remaining usable life in a lithium ion battery.

This section is intended to introduce the reader to various aspects of art that may be related to various aspects of the present disclosure, which are described below. This discussion is believed to be helpful in providing the reader with background information to facilitate a better understanding of the various aspects of the present disclosure. Accordingly, it should be understood that these statements are to be read in this light, and not as admissions of prior art.

A vehicle that uses one or more battery systems for providing all or a portion of the motive power for the vehicle can be referred to as an xEV, where the term "xEV" is defined herein to include all of the following vehicles, or any variations or combinations thereof, that use electric power for all or a portion of their vehicular motive force. For example, xEVs include electric vehicles (EVs) that utilize electric power for all motive force. As will be appreciated by those skilled in the art, hybrid electric vehicles (HEVs), also considered xEVs, combine an internal combustion engine propulsion system and a battery-powered electric propulsion system, such as 48 Volt (V) or 130V systems. The term HEV may include any variation of a hybrid electric vehicle. For example, full hybrid systems (FHEVs) may provide motive and other electrical power to the vehicle using one or more electric motors, using only an internal combustion engine, or using both. In contrast, mild hybrid systems (MHEVs) disable the internal combustion engine when the vehicle is idling and utilize a battery system to continue powering the air conditioning unit, radio, or other electronics, as well as to restart the engine when propulsion is desired. The mild hybrid system may also apply some level of power assist, during acceleration for example, to supplement the internal combustion engine. Mild hybrids are typically 96V to 130V and recover braking energy through a belt or crank integrated starter generator. Further, a micro-hybrid electric vehicle (mHEV) also uses a "Stop-Start" system similar to the mild hybrids, but the micro-hybrid systems of a mHEV may or may not supply power assist to the internal combustion engine and operates at a voltage below 60V. For the purposes of the present discussion, it should be noted that mHEVs typically do not technically use electric power provided directly to the crankshaft or transmission for any portion of the motive force of the vehicle, but an mHEV may still be considered as an xEV since it does use electric power to supplement a vehicle's power needs when the vehicle is idling with internal combustion engine disabled and recovers braking energy through an integrated starter generator. In addition, a plug-in electric vehicle (PEV) is any vehicle that can be charged from an external source of electricity, such as wall sockets, and the energy stored in the rechargeable battery packs drives or contributes to drive the wheels. PEVs are a subcategory of EVs that include all-electric or battery electric vehicles (BEVs), plug-in hybrid electric vehicles (PHEVs), and electric vehicle conversions of hybrid electric vehicles and conventional internal combustion engine vehicles.

xEVs as described above may provide a number of advantages as compared to more traditional gas-powered vehicles using only internal combustion engines and traditional electrical systems, which are typically 12V systems powered by a lead acid battery. For example, xEVs may produce fewer undesirable emission products and may exhibit greater fuel efficiency as compared to traditional internal combustion vehicles and, in some cases, such xEVs may eliminate the use of gasoline entirely, as is the case of certain types of EVs or PEVs.

As technology continues to evolve, there is a need to provide improved power sources, particularly battery modules, for such vehicles. For example, lithium ion (Li-ion) battery modules may experience degradation over time. As a result, lithium ion battery modules are generally considered to be suitable for use for a certain length of time, depending on how the battery modules are used, etc. As lithium ion battery modules near the end of their useful life, they may exhibit a change in their electrical properties. This may be manifest as a reduction in charge and discharge capability, for instance. Accordingly, it may be desirable to evaluate the state of a lithium ion battery module to predict its remaining usable life.

Lithium ion battery modules may predict remaining usable life based on electrical measurements using, for example, algorithms stored in a battery monitoring system (BMS), or a battery control module (BCM). However, it is now recognized that such electrical measurements of the battery modules may not be measured easily and accurately and may be subject to variability. Accordingly, it is now recognized that it may be desirable to have a system and method for enhanced life estimation of batteries, especially lithium-ion battery modules.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

The present disclosure relates to batteries and battery modules. More specifically, the present disclosure relates to life estimation for lithium ion battery modules that may be used in vehicular contexts (e.g., xEVs) as well as other energy storage/expending applications (e.g., energy storage for an electrical grid).

The present disclosure relates to a battery module. The battery module includes a housing. The battery module also includes a cell stack disposed in the housing and including a battery cell. The battery module also includes a force gauge in mechanical communication with the cell stack and configured to measure a force generated by a swelling of the cell stack. The battery module also includes a control module configured to receive data indicative of the force and to estimate a remaining usable life of the battery module based on the data.

The present disclosure also relates to a lithium ion battery module. The lithium ion battery module includes a housing. The lithium ion battery module also includes a plurality of lithium ion battery cells disposed in the housing. The plurality of lithium ion battery cells are arranged in a cell stack. The lithium ion battery module also includes a force gauge mechanically coupled to the plurality of lithium ion battery cells and configured to measure a force generated by a swelling of the cell stack. The lithium ion battery module also includes a control module communicatively coupled to the force gauge and configured to receive data indicative of the force and to estimate a remaining usable life of the lithium ion battery module based on the data.

The present disclosure also relates to a method of making a lithium ion battery module. The method includes assembling a plurality of lithium ion battery cells into a cell stack. The method also includes positioning the cell stack in a housing. The method also includes positioning a force gauge along a direction of swelling of the cell stack between a lithium ion battery of the plurality of lithium ion battery cells and the housing.

DRAWINGS

Various aspects of the disclosure may be better understood upon reading the following detailed description and upon reference to the drawings in which.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

The battery systems described herein may be used to provide power to various types of electric vehicles (xEVs) and other high voltage energy storage/expending applications (e.g., electrical grid power storage systems). Such battery systems may include one or more battery modules, each battery module having a housing and a number of battery cells (e.g., lithium ion (Li-ion) electrochemical cells) arranged within the housing to provide particular voltages and/or currents useful to power, for example, one or more components of an xEV. As another example, battery modules in accordance with present embodiments may be incorporated with or provide power to stationary power systems (e.g., non-automotive systems).

As noted above, lithium ion battery modules may experience degradation over time. As lithium ion battery modules near the end of their useful life, they may exhibit a change in their electrical properties. This may be manifest as a reduction in charge and discharge capability, for instance. Lithium ion battery modules may predict remaining usable life based on electrical measurements using, for example, algorithms stored in a battery monitoring system (BMS), or a battery control module (BCM). However, it is now recognized that such electrical measurements of the battery modules may not be measured easily and accurately and may be subject to variability. Present embodiments include physical battery module features, assembly components, manufacturing and assembling techniques, and so forth, that facilitate life estimation of battery modules and systems, especially lithium ion battery modules, in a manner that may be easy to implement and may provide more accurate estimation results. More specifically, present embodiments provide systems and methods for life estimation for lithium ion battery modules based on mechanical forces generated by the battery cells (e.g., due to swelling).

A lithium ion battery module may include one or more lithium ion battery cells, each of which has a cell casing (e.g., a hard casing such as a metallic or hard plastic casing in prismatic cells or a relatively soft casing such as a soft polymer or metal foil casing in pouch cells) in which an electrode winding is arranged. The electrode winding includes two metallic substrates for a cathode and an anode. The two substrates are coated an active cathode material and an active anode material, respectively. Between the two substrates there is a separator. The lithium ion battery cell may be subject to considerable expansion of volume and contraction of volume due to different states of charge. For example, in certain prismatic battery cells, a relatively large degree of size change may occur as a result of charge and discharge cycles, where during charging, lithium ions become intercalated into the anode active material (e.g., graphite), causing the anode to swell, while during discharging, the anode active material releases lithium ions, causing the anode to reduce in size. Also, the electrochemical processes within the lithium ion battery cells may cause heating of the cells, which can cause other chemical transformations, such as a breakdown of solvents (e.g., electrolyte) to occur. This breakdown may form gaseous by-products, which further increase the internal pressure of the cell, causing it to swell. These processes may cause an overall increase in swelling of the lithium ion battery cell. In addition, as the lithium ion battery cell ages (e.g., experiences more charge/discharge cycles), the swelling force may increase on a calendar basis with age. It is now recognized that the processes described above, among others, which result in swelling, correspond to the electrical properties of the cell. It is also now recognized that the overall force applied to the casing of the lithium ion battery cell can be related to the state of health of the battery cell.

In accordance with the present disclosure, a force-measuring device or sensor, such as a force transducer, may be coupled externally to a casing of one or more lithium ion battery cells in a lithium ion battery module. The force-measuring device may measure the force collectively generated by the one or more lithium ion battery cells (e.g., from swelling) and applied to the casing of the one or more lithium ion battery cells. Based on a relationship between the force applied to the casing of the one or more lithium ion battery cells and the number of the charge/discharge cycles, the state of health of the lithium ion battery module may be predicted or estimated. As set forth below, the presently disclosed systems for battery life estimation includes configurations that do not necessarily involve modification of design of individual battery cells, and do not necessarily involve complex instrumentation for measuring electrical properties (e.g., capacity and/or resistance) of the battery cells. In addition, the system and method disclosed herein may be applicable to a wide variety of battery cells, including various types and configurations of lithium ion battery cell chemistries. Furthermore, the system and method disclosed herein may be easily integrated with existing battery control modules or systems (e.g., BMS's or BCM's).

Figure 1:
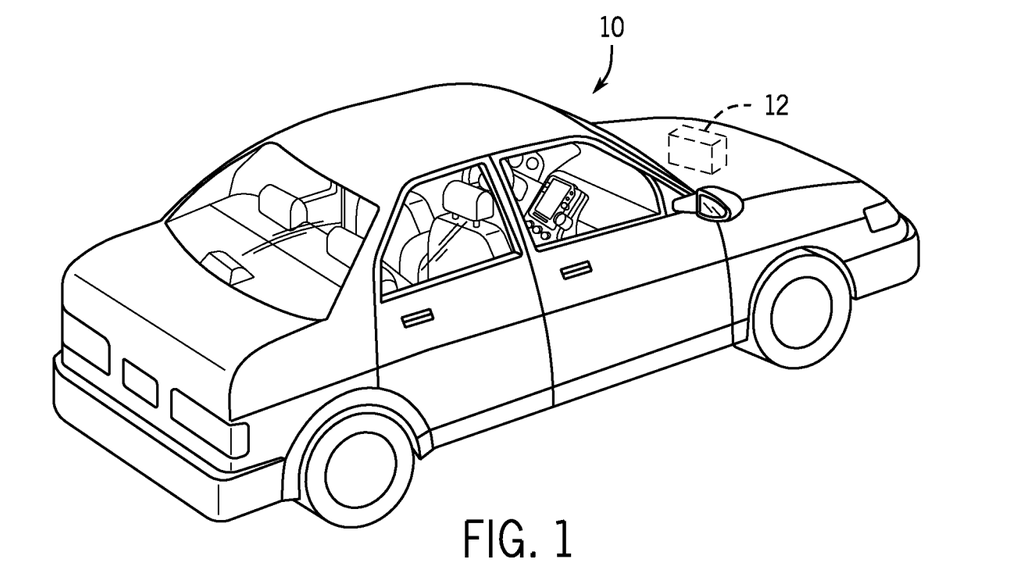
FIG. 1 is a perspective view of a vehicle (an xEV) having a battery system contributing all or a portion of the power for the vehicle, in accordance with an embodiment of the present approach.

Again, the battery modules configured in accordance with present embodiments may be employed in any number of energy expending systems (e.g., vehicular contexts and stationary power contexts). To facilitate discussion, embodiments of the battery modules described herein are presented in the context of advanced battery modules (e.g., lithium ion battery modules) employed in xEVs. With the foregoing in mind, FIG. 1 is a perspective view of such a vehicle 10 (e.g., an xEV). Although the following discussion in presented in relation to vehicles with regenerative braking systems, the techniques described herein are adaptable to other vehicles that capture/store electrical energy with a battery, which may include electric-powered and gas-powered vehicles.

It may be desirable for a battery system 12 to be largely compatible with traditional vehicle designs. Accordingly, the battery system 12 may be placed in a location in the vehicle 10 that would have housed a traditional battery system. For example, as illustrated, the vehicle 10 may include the battery system 12 positioned similarly to a lead-acid battery of a typical combustion-engine vehicle (e.g., under the hood of the vehicle 10). Furthermore, as will be described in more detail below, the battery system 12 may be positioned to facilitate managing temperature of the battery system 12. For example, in some embodiments, positioning a battery system 12 under the hood of the vehicle 10 may enable an air duct to channel airflow over the battery system 12 and cool the battery system 12.

Figure 2:
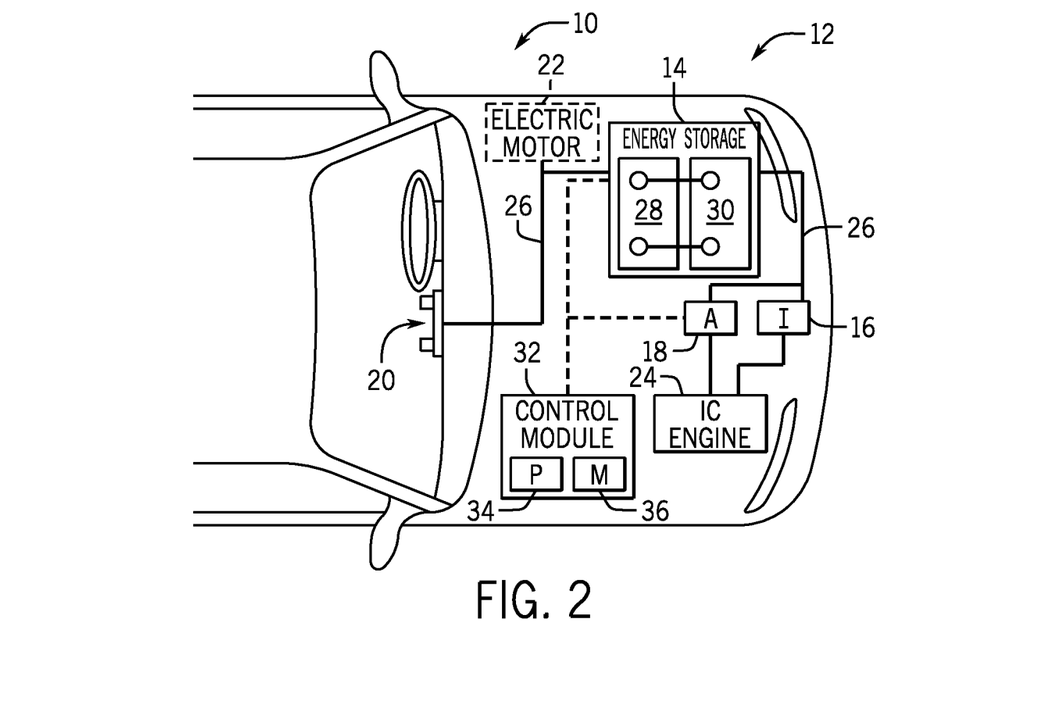
FIG. 2 is a cutaway schematic view of the xEV embodiment of FIG. 1, in the form of a hybrid electric vehicle (HEV) having a battery module with compression features configured in accordance with an embodiment of the present approach.

A more detailed view of the battery system 12 is described in FIG. 2. As depicted, the battery system 12 includes an energy storage component 14 coupled to an ignition system 16, an alternator 18, a vehicle console 20, and optionally to an electric motor 22. Generally, the energy storage component 14 may capture/store electrical energy generated in the vehicle 10 and output electrical energy to power electrical devices in the vehicle 10.

In other words, the battery system 12 may supply power to components of the vehicle's electrical system, which may include radiator cooling fans, climate control systems, electric power steering systems, active suspension systems, auto park systems, electric oil pumps, electric super/turbochargers, electric water pumps, heated windscreen/defrosters, window lift motors, vanity lights, tire pressure monitoring systems, sunroof motor controls, power seats, alarm systems, infotainment systems, navigation features, lane departure warning systems, electric parking brakes, external lights, or any combination thereof. In the depicted embodiment, the energy storage component 14 supplies power to the vehicle console 20 and the ignition system 16, which may be used to start (e.g., crank) the internal combustion engine 24.

Additionally, the energy storage component 14 may capture electrical energy generated by the alternator 18 and/or the electric motor 22. In some embodiments, the alternator 18 may generate electrical energy while the internal combustion engine 24 is running. More specifically, the alternator 18 may convert the mechanical energy produced by the rotation of the internal combustion engine 24 into electrical energy. Additionally or alternatively, when the vehicle 10 includes an electric motor 22, the electric motor 22 may generate electrical energy by converting mechanical energy produced by the movement of the vehicle 10 (e.g., rotation of the wheels) into electrical energy. Thus, in some embodiments, the energy storage component 14 may capture electrical energy generated by the alternator 18 and/or the electric motor 22 during regenerative braking. As such, the alternator and/or the electric motor 22 are generally referred to herein as a regenerative braking system.

To facilitate capturing and supplying electric energy, the energy storage component 14 may be electrically coupled to the vehicle's electric system via a bus 26. For example, the bus 26 may enable the energy storage component 14 to receive electrical energy generated by the alternator 18 and/or the electric motor 22. Additionally, the bus 26 may enable the energy storage component 14 to output electrical energy to the ignition system 16 and/or the vehicle console 20. Accordingly, when a 12 volt battery system 12 is used, the bus 26 may carry electrical power typically between 8-18 volts.

Additionally, as depicted, the energy storage component 14 may include multiple battery modules. For example, in the depicted embodiment, the energy storage component 14 includes a lithium ion (e.g., a first) battery module 28 and a lead-acid (e.g., a second) battery module 30, which each includes one or more battery cells. In other embodiments, the energy storage component 14 may include any number of battery modules. Additionally, although the lithium ion battery module 28 and lead-acid battery module 30 are depicted adjacent to one another, they may be positioned in different areas around the vehicle. For example, the lead-acid battery module may be positioned in or about the interior of the vehicle 10 while the lithium ion battery module 28 may be positioned under the hood of the vehicle 10.

In some embodiments, the energy storage component 14 may include multiple battery modules to utilize multiple different battery chemistries. For example, when the lithium ion battery module 28 is used, performance of the battery system 12 may be improved since the lithium ion battery chemistry generally has a higher coulombic efficiency and/or a higher power charge acceptance rate (e.g., higher maximum charge current or charge voltage) than the lead-acid battery chemistry. As such, the capture, storage, and/or distribution efficiency of the battery system 12 may be improved.

To facilitate controlling the capturing and storing of electrical energy, the battery system 12 may additionally include a control module 32. More specifically, the control module 32 may control operations of components in the battery system 12, such as relays (e.g., switches) within energy storage component 14, the alternator 18, and/or the electric motor 22. For example, the control module 32 may regulate amount of electrical energy captured/supplied by each battery module 28 or 30 (e.g., to de-rate and re-rate the battery system 12), perform load balancing between the battery modules 28 and 30, determine a state of charge of each battery module 28 or 30, determine temperature of each battery module 28 or 30, control voltage output by the alternator 18 and/or the electric motor 22, and the like.

Accordingly, the control unit 32 may include one or more processors 34 and one or more memory 36. More specifically, the one or more processors 34 may include one or more application specific integrated circuits (ASICs), one or more field programmable gate arrays (FPGAs), one or more general purpose processors, or any combination thereof. Additionally, the one or more memory 36 may include volatile memory, such as random access memory (RAM), and/or non-volatile memory, such as read-only memory (ROM), optical drives, hard disc drives, or solid-state drives. In some embodiments, the control unit 32 may include portions of a vehicle control unit (VCU) and/or a separate battery control module. Furthermore, as depicted, the lithium ion battery module 28 and the lead-acid battery module 30 are connected in parallel across their terminals. In other words, the lithium ion battery module 28 and the lead-acid module 30 may be coupled in parallel to the vehicle's electrical system via the bus 26.

Figure 3:
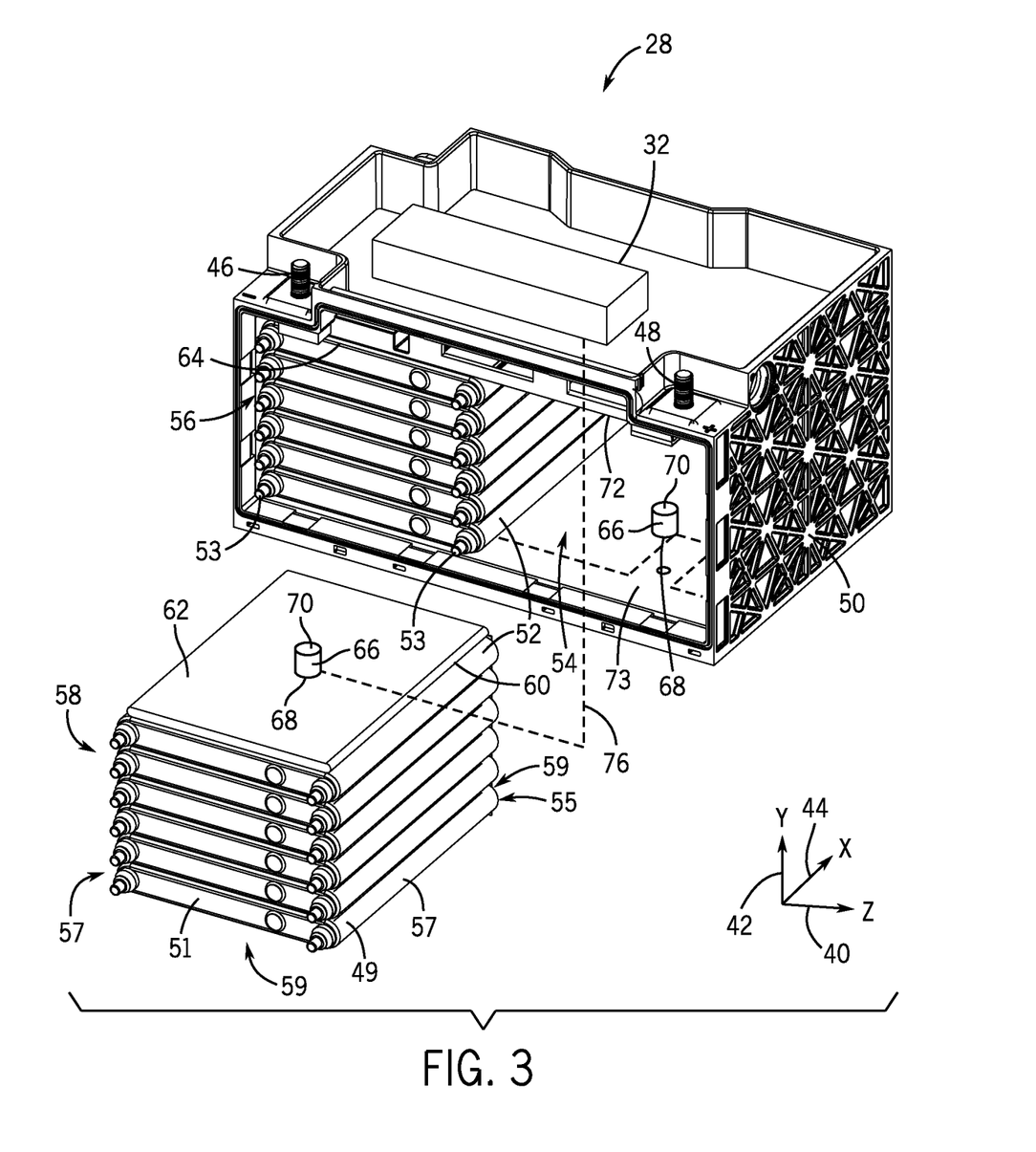
FIG. 3 is a front top perspective view of a battery module, in accordance with an embodiment of the present disclosure.

The lithium ion battery modules 28 may have any one of a variety of different shapes, sizes, output voltages, capacities, and so forth, and the present disclosure is generally intended to apply to different variations of the shapes and sizes of the modules illustrated in the figures. Keeping this in mind, FIG. 3 is a front top perspective view of one embodiment of the battery module 28. To facilitate discussion of the battery module 28 and the various assemblies and components thereof, a Z axis 40 is defined as extending through the length of battery module 28, a Y axis 42 is defined as extending through the thickness of the battery module 28 (transverse to the length in a first direction), and an X axis 44 is defined as extending through a width of the battery module 28 (transverse to the length and the thickness).

As illustrated, the lithium ion battery module 28 includes a first terminal 46 (e.g., a negative terminal) and a second terminal 48 (e.g., a positive terminal) that may be coupled to an electrical load (e.g., circuit) for providing power to the xEV 10. In other embodiments, the battery module 28 may have more than two terminals, for example, to provide different voltages for different loads via connections across different terminal combinations.

The lithium ion battery module 28 includes a housing 50 for packaging or containing one or more lithium ion battery cells 52 and other components of the battery module 28. For example, the housing 50 may package one or more prismatic battery cells. The housing 50 may be metallic (e.g., made from steel, aluminum, or another suitable metal), may be polymeric (e.g., polypropylene, acrylonitrile butadiene styrene (ABS), a polystyrene (PS), a polyimide (PI), or another suitable polymer or plastic or combination thereof), or any other suitable housing material or combination of materials.

The housing 50 includes a cell receptacle region 54 configured to receive the one or more battery cells 52. In the illustrated embodiment, the one or more battery cells 52 includes two cell stacks (e.g., a first stack 56 and a second stack 58), and each cell stack 56, 58 includes six prismatic battery cells 52 disposed on top (e.g., along the Y axis 42) of one another. However, the lithium ion battery module 28 may include any number (e.g., 1, 2, 3, 4, 5, 6, 7, 8, 9, or more) of cell stacks, and each cell stack may include any number (e.g., 1, 2, 3, 4, 5, 6, 7, 8, 9, or more) of battery cells 52.

Also, the one or more battery cells 52 of the lithium ion battery module 28 may include any type of cell chemistry, where, by way of example, the cathode active material may be a lithium metal oxide (LMO) component. As used herein, lithium metal oxides (LMOs) may refer to any class of materials whose formula includes lithium and oxygen as well as one or more additional metal species (e.g., nickel, cobalt, manganese, aluminum, iron, or another suitable metal). A non-limiting list of example LMOs may include: mixed metal compositions including lithium, nickel, manganese, and cobalt ions such as lithium nickel cobalt manganese oxide (NMC) (e.g., $LiNi_{1/3}Co_{1/3}Mn_{1/3}O_2$), lithium nickel cobalt aluminum oxide (NCA) (e.g., $LiNi_{0.8}Co_{0.15}Al_{0.05}O_2$), lithium cobalt oxide (LCO) (e.g., $LiCoO_2$), and lithium metal oxide spinel (LMO-spinel) (e.g., $LiMn_2O_4$). Other cathode active materials may be utilized in addition to or in lieu of these materials, such as lithium metal phosphates. Examples of such active materials are generally defined by the formula $LiMPO_4$, wherein M is Fe, Ni, Mn, or Mg, with one particular example including lithium iron phosphate (LiFePO4, LFP). Any one or a combination of these phosphates may be used as the cathode active material, in addition to or in lieu of any one or a combination of the lithium metal oxide materials encompassed by the description above. Anode active materials may include graphite, lithium titanate ($LiTiO_2$, LTO), and other suitable anode active materials. Some non-limiting examples of cell chemistries may include, NMC/LTO, NMC/graphite, LMO/LTO, LMO/graphite, LFP/graphite or the like. In some embodiments, the cell chemistry may include LFP as the cathode active material (e.g., LFP/graphite or LFP/LTO battery cells), for which the present techniques may be particularly useful. Specifically, LFP displays a relatively flat charging curve (e.g., voltage profile as a function of state of charge, SOC), which may enable very accurate correlations to the measurements described herein for life estimation.

The battery cells may also have any suitable cell shape (e.g., prismatic, cylindrical, pouch, or any other), and cell size. As illustrated, each battery cell 52 includes a casing 49 including six sides: a top 51 (e.g., substantially on the plane defined by Y-Z axes 42, 40), on which disposed two electrodes 53, a bottom 55 (e.g., substantially on the plane defined by Y-Z axes 42, 40), two sides 57 (e.g., substantially on the plane defined by X-Y axes 44, 42), and two faces 59 (e.g., substantially on the plane defined by X-Z axes, 44, 40).

As noted above, the present disclosure provides systems and methods for life estimation of a lithium ion battery module based on force applied to the casing of one or more lithium ion battery cells of the lithium ion battery module. As illustrated, a substantially flat plate 60 is disposed on (e.g., in abutment with, or mechanically coupled to) the second cell stack 58 (e.g., one of the faces 59 of one battery cell 52). The plate 60 may be coupled to the second cell stack 58 without or with any bonding agents (e.g., adhesive). In the illustrated embodiment, the plate 60 is substantially cuboid with a cross section (e.g., a side 62 on the Y axis 42) having substantially the same surface area as one of the faces 59 of one of the battery cells 52 of the second cell stack 58 such that the plate 60 substantially covers one of the faces 59 of the one of the battery cells. However, it should be noted that the plate 60 may be in any suitable shape and size. For example, the cross section (e.g., the side 62) of the plate 60 may be a square, rectangle, triangle, circle, oval, or the like. The size of the cross section (e.g., the side 62) of the plate 60 may be greater, substantially the same, or less than the surface area of one of the faces 59 of one of the battery cells 52.

In the illustrated embodiment, a force gauge 66 is disposed on the side 62 of the plate 60. The force gauge 66 may be any type of force-measuring device, such as a force sensor, or a force transducer, that is configured to measure force applied to the force gauge 66 (e.g. along the Y-axis 42). In some embodiments, the force gauge 66 may include a fixed end 68 that is anchored to the plate 60 and a sensing end 70 (e.g., a movable end) that is configured to touch an interior surface 72 of the module housing 50 (e.g., the receptacle region 54). As will be discussed in greater detail below, as the battery cells 52 of the second cell stack 58 age, they may expand in dimensions (e.g., along the Y axis 42) due to force generated by the electrodes 53 of the respective battery cell 52, as well as gas generation from the electrolytes. This results in a collective expansion of the second cell stack 58 in dimensions (e.g., along the Y axis 42). In other words, the force gauge 66 may be in mechanical communication with the second cell stack 58 and may be configured to measure the force generated by the swelling of the second cell stack 58 (e.g., along the Y-axis 42).

During operation, when the second cell stack 58 is disposed in the receptacle region 54 (e.g., as illustrated for the first cell stack 56), the expansion of the second cell stack 58 (e.g., along the +Y direction 42) may cause the sensing end 70 of the force gauge 66 to be urged along the +Y direction 42 against the interior surface 72 of the module housing 50 (e.g., the receptacle region 54). The force gauge 66 thereby measures the force collectively generated by the swelling of the battery cells 52. As will be discussed in greater detail below, correlating this force to one or more electrical characteristics of the battery cells 52 may enable an estimation of where the battery cells 52 are presently operating relative to a life expectancy of the battery cells 52. In other words, the measured force may be used for life estimation of the cell stacks 56, 58.

The force gauge 66 may be coupled to the second battery stack 58 in various configurations. In one embodiment, the force gauge 66 may be coupled directly to one of the sides 59 of one battery cell 52 of the second battery stack 58, without employing the plate 60. The battery cell 52, to which the force gauge 66 is coupled, may be a battery cell 52 at the end of the second battery stack 58 or one in the middle segment of the second battery stack 58. In another embodiment, while the plate 60 may still be disposed on the second battery stack 58, the force gauge 66 may be coupled to the interior surface 72, with the fixed end 68 anchored to the interior surface 72 and the sensing end 70 touching the plate 60. In yet another embodiment, an additional plate (e.g., similar to the plate 60) may be coupled to the interior surface 72 such that the force gauge 66 is sandwiched between the additional plate and the plate 60. In a still further embodiment, it should be noted that the force gauge 66 may, in addition to or in lieu of being disposed on the plate 60, be disposed on the interior surface 72, or any other interior surface (e.g., a second interior surface 73) that abuts the cell stack 58 (e.g., at all times or only when they swell). In the illustrated embodiment of FIG. 3, the force gauge 66 is depicted as being disposed on the second interior surface 73, though it may be placed in any other suitable location. Furthermore, while in the illustrated embodiment, the plate 60 and the force gauge 66 are disposed on the second cell stack 58 to measure the swelling force of the second cell stack 58, another set of plate and force gauge may be similarly coupled to the first cell stack 56 to independently measure the swelling force of the first cell stack 56. In another embodiment, the plate 60 may be coupled to (e.g., to cover all or portion of the surface on the plane defined by the X-Z axes 44, 40) both the first cell stack 56 and the second cell stack 58 simultaneously to measure the swelling force collectively generated by the battery cells 52 of both of the first and the second cell stacks 56, 58.

It should be noted that the force measured or sensed by the force gauge 66 may include other forces besides the swelling force generated by the battery cells 52. As another example, when the battery module 28 is placed in the vehicle 10 and the vehicle 10 is placed in operation (e.g., running on a road), the vehicle 10 may be subject to vibrations (e.g., from contacts between the vehicle and the road), which may be transferred to the battery module 28. As such, there may be relatively small, oscillatory forces between each of the cell stacks 56, 58 and the module housing 50 (e.g., the interior surface 72). Accordingly, the force measured or sensed by the force gauge 66 may also correspond to vibrational forces due to the operation of the vehicle 10. Because such vibrational forces are largely noise from a life estimation standpoint, the vibrational forces may be decoupled (or deconvolved) from the overall measured force for estimation accuracy.

The measured or sensed force may be converted by the force gauge 66 to a signal 76 (e.g., electrical, magnetic, mechanical, electromagnetic, hydraulic, or a combination thereof) depending on the type of the force gauge 66 used. The signal 76 may be transmitted to the control unit 32 for storage and/or processing (e.g., by the one or more processors 34 and the one or more memory 36). As will be discussed in greater detail below, the signal 76 corresponding to the force measured by the force gauge 66 may be processed to determine electrical characteristics of the battery cells 52 indicative of their remaining usable life via estimation procedures.

Figure 4:
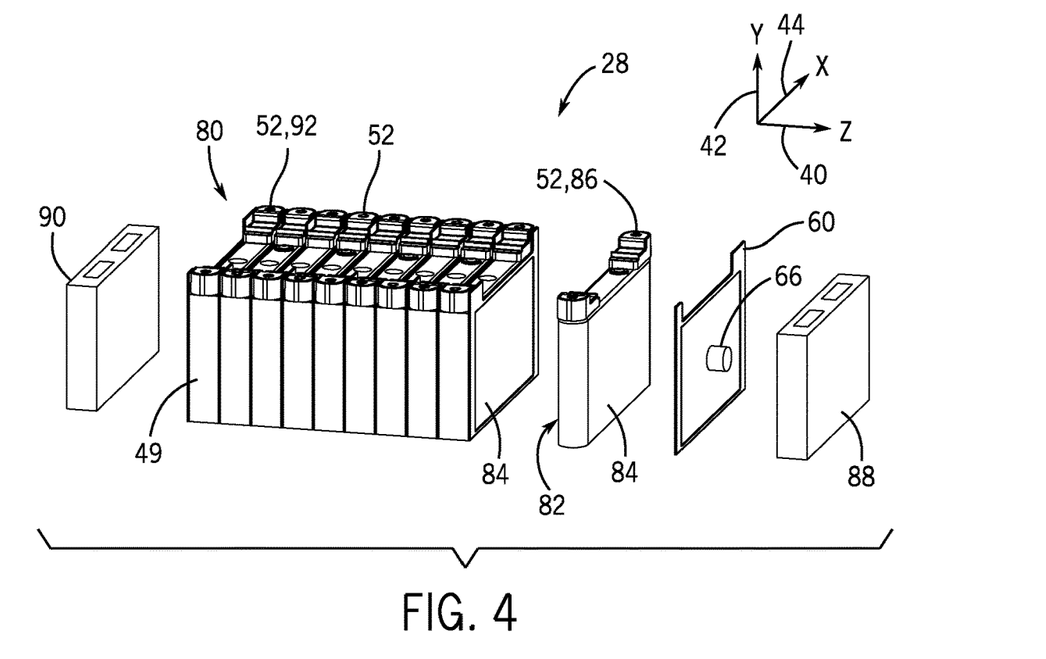
FIG. 4 is an exploded perspective view of an embodiment of a battery module, in accordance with the present disclosure.
Figure 5:
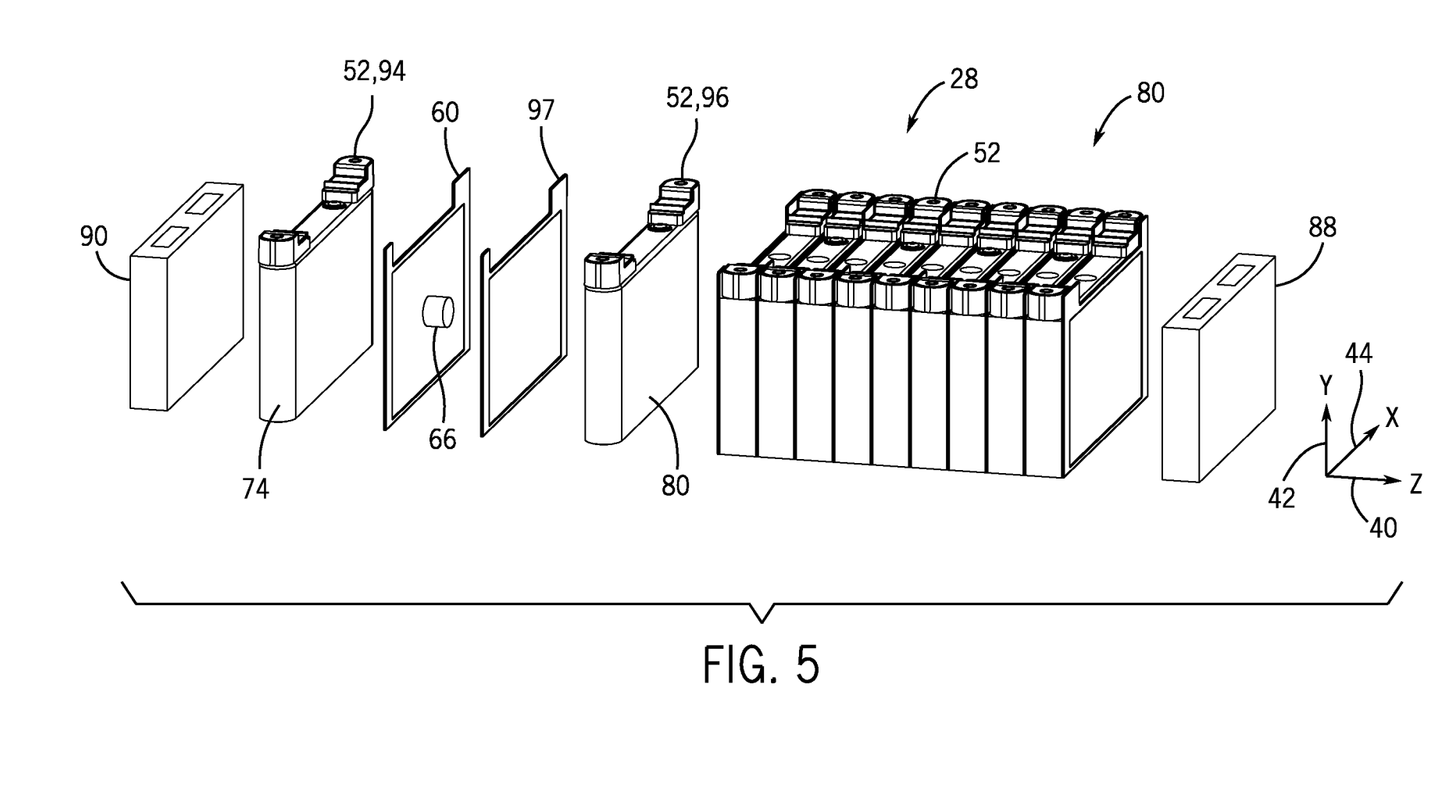
FIG. 5 is an exploded perspective view of an embodiment of a battery module, in accordance with the present disclosure.

As noted above, the force gauge 66 may be integrated into the battery module 28 in various configurations. For example, FIGS. 4 and 5 are exploded perspective views of two embodiments, respectively, of the battery module 28 including the force gauge 66 configured to measure the force resulting from swelling of the one or more battery cells 52. While any single type of battery cell 52 may be utilized, the battery cells 52 used in the battery module 28 may all have the same general shape (e.g., prismatic, cylindrical, pouch, or any other), the same electrochemistry (e.g., electrode active materials, electrolytes, additives), the same general dimensions (e.g., to within manufacturing tolerances), and other similar design features (e.g., electrical isolation).

As illustrated in FIG. 4, the battery cells 52 may be arranged in a cell stack 80. Each of the battery cells 52 may include the casing 49 including a left face 82 and a right face 84. The battery cells 52 may be coupled to one another with the right face 84 of one battery cell 52 pressed against the left face 82 of an adjacent battery cell 52 (to the right). For illustrative purposes, a rightmost battery cell 86 is shown as separate from the rest of the cell stack 80. The plate 60 (e.g., a spacer) may be coupled to the right face 84 of the rightmost battery cell 86. The force gauge 66 may be coupled to the plate 60 and disposed in between the plate 60 and a right retaining wall 88 (or another battery cell). The force gauge 66 is configured to measure the swelling force generated by the battery cells 52 along a swelling direction (e.g., the Z axis 40). The cell stack 80 may also include a left retaining wall 90 such that all of the battery cells 52, the plate 60, and the force gauge 66 may be pressed against one another between the left and the right retaining walls 90, 88 for assembly (e.g., before or after introduction into the module housing 50). In some embodiments, the plate 60 and the force gauge 66 may be coupled to the left end of the cell stack 80 (e.g., between a leftmost battery cell 92 and the left retaining wall 90.

The plate 60 and the force gauge 66 may also be included in the cell stack 80 between any two adjacent battery cells 52. For example, as illustrated in FIG. 5, the plate 60 and the force gauge 66 are disposed between a first battery cell 94 and a second battery cell 96 of the cell stack 80, with the force gauge 66 being sandwiched between the plate 60 and an additional plate 97 (e.g., an additional spacer). Again, all of the battery cells 52, the plate 60, and the force gauge 66 may be pressed against one another between the two retaining walls 90, 88 for assembly before or after introduction into the module housing 50.

Figure 8:
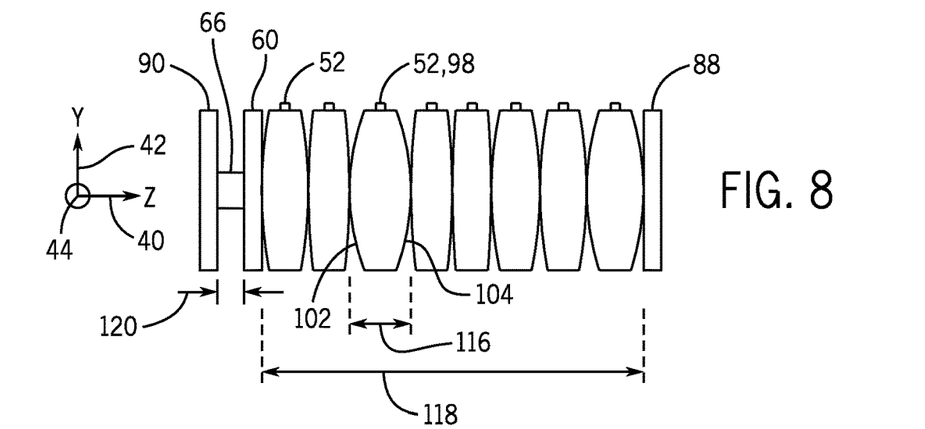
FIG. 8 is a schematic view of an embodiment of a battery module in a relatively late stage of life, in accordance with the present disclosure.

As noted above, the battery cells 52 may swell to cause dimensional changes due to electrode swelling and/or generation of gas from the electrolyte. Thus, the battery module 28 (e.g., the cell stack 56, 58, 80) including one or more battery cells 52 may collectively generate a force and apply the force the housing of the battery module 28. As the battery module 28 ages (e.g., experiencing more charge/discharge cycles), the degree of the swelling of the battery cells 52 may increase. Accordingly, the force applied to the housing of the battery module 28 may increase as the battery module 28 ages. For example, FIGS. 6 and 8 illustrate, respectively, an embodiment of battery module 28 in a relatively early stage of life (e.g., having experienced a few charge/discharge cycles) and a relatively late stage of life (e.g., having experienced a few hundred charge/discharge cycles).

Figure 6:
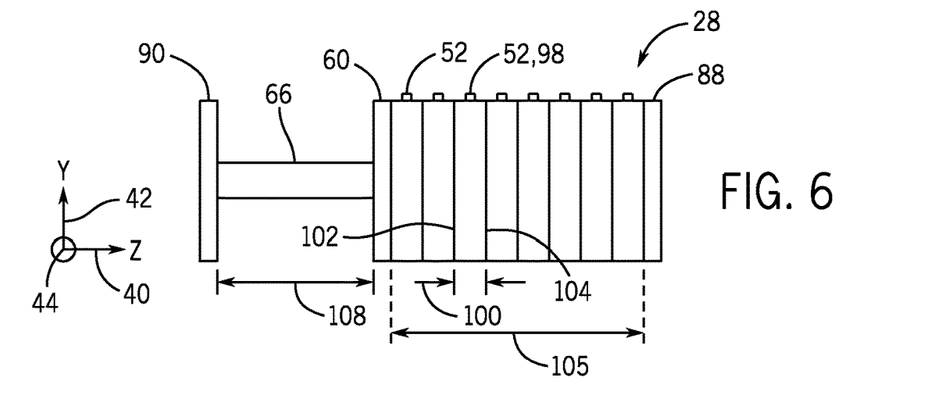
FIG. 6 is a schematic view of an embodiment of a battery module in a relatively early stage of life, in accordance with the present disclosure.

FIG. 6 illustrates schematically an embodiment of the battery module 28 that includes the force gauge 66 configured to measure the force applied to the one or more battery cells 52 (e.g., along the dimension of swelling, such as the Z axis 40) when the battery module 28 is in a relatively early stage of life (e.g., having experienced a few charge/discharge cycles). The force gauge 66 is shown as being expanded for clarity, and is not intended to represent any particular dimensions. Indeed, it should be appreciated that the dimensional change experienced by the force gauge 66, in an actual implementation, is actually quite small (e.g., on a scale of millimeters, on a scale of microns, or on a scale of nanometers). At relatively early stage of life, the battery module 28 exhibits little to no permanent swelling. More specifically, each battery cell 52 of the battery module 28 may exhibit little to no swelling. As an example, a third battery cell 98 of the battery module 28 may have a first thickness 100 (e.g., along the Z axis 40) that is substantially the same as the original thickness (e.g., the manufacturing thickness). A left face 102 and a right face 104 of the third battery cell 98 may be substantially vertical (e.g., with respect to the Z axis 40) and be closely pressed against the adjacent battery cells 52. The one or more battery cells 52 may have a first overall thickness 105 (e.g., along the Z axis 40).

As illustrated, the force gauge 66 is disposed between the left retaining wall 90 and the plate 60 and configured to measure a collective swelling force generated by the battery cells 52 of the battery module 88 (e.g., along a swelling direction, such as the Z axis 40). The left and right retaining walls 90, 88 may be fixed with respect to the module housing 50. The ends (e.g., the fixed end 68 and the sensing end 70) of the force gauge 66 may be pressed against both of the left retaining wall 90 and the plate 60. For example, the force gauge 66 may have a first thickness 108 (e.g., along the Z axis 40) between the left retaining wall 90 and the plate 60. The first thickness 108 may correspond to a relatively small amount of force (e.g., the force generated by an initial thickness and compression of the battery cells 52).

Figure 7:
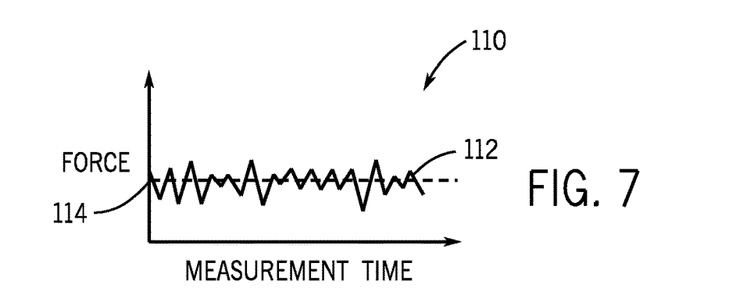
FIG. 7 is a chart of measured force for the battery module of FIG. 6, in accordance with the present disclosure.

FIG. 7 illustrates a graphical representation, especially a chart 110 of measured force (e.g., by the force gauge 66) for the battery module 28 in the relatively early stage of life (e.g., as illustrated in FIG. 6). The chart 110 includes a first force curve 112 as a function of measurement time. The measurement time may generally be shorter than the lifetime (e.g., months, or years) of the battery module 28, such as a few seconds, minutes, or hours. The measurement timing may be at or near any point of a battery cycle (e.g., a charge/discharge cycle), such as at a state of charge between approximately 100% and 10%, or between approximately 90% and 20%, or between approximately 80% and 30%, or between approximately 70% and 40%, or between approximately 60% and 50%. As a specific example, the first force curve 112 may be collected when the battery module 28 is at approximately 10% of state of charge.

As illustrated, the first force curve 112 generally fluctuates about a first average force 114 during a period of measurement time. The first average force 114 may be relatively small because, as illustrated in FIG. 6, the battery module 28 is in the relatively early stage of life, when the battery cells 52 of the battery module 28 may exhibit little to no permanent swelling (e.g., swelling that is not reversible using charge/discharge). The fluctuations in the first force curve 112 may come from the force gauge 66 (e.g., standard deviations of the force measurement) and/or external vibrations (e.g., vibrations from the vehicle 10 in which the battery module 28 is placed), as discussed above. The fluctuations due to the external vibrations may be decoupled from the first force curve 112 before determining the first average force 114. The decoupling of the signal components due to the external vibrations may be conducted by the control module 32 using any suitable methods. As an example, the control module 32 may include a low-pass filter to filter out the force components due to the external vibrations. Generally the force change due to the battery cycle (e.g., charge/discharge cycle) may be on a longer time scale (therefore a smaller frequency) compared to environmental conditions (e.g., the external vibrations). As another example, the control module 32 may include a model force profile corresponding to historical or experimental data on external vibrations of the battery module 28 in the vehicle 10 or similar environment. The control module 32 may then decouple the force components due to the external vibrations from the measured force based on the template force profile.

FIG. 8 illustrates the embodiment of the battery module 28 at a relatively late stage of life (e.g., having experienced hundreds of charge/discharge cycles). At the relatively late stage of life, the battery module 28 may exhibit a relatively increased amount of permanent swelling compared to the embodiment of FIG. 6. More specifically, each battery cell 52 of the battery module 28 may exhibit different or the same degrees of swelling. As an example, the third battery cell 98 of the battery module 28 may have a second thickness 116 (e.g., along the Z axis 40) that is greater than the first thickness 100. The left face 102 and the right face 104 of the third battery cell 98 may be convex toward the left retaining wall 90 and the right retaining wall 88, respectively. The one or more battery cells 52 may have a second overall thickness 118 (e.g., along the Z axis 40) that is greater than the first overall thickness 105.

As illustrated, as the one or more battery cells 52 swell (e.g., along the Z axis 40), the force gauge 66 may be pressed by the one or more battery cells 52, via the plate 60, further toward the left retaining wall 90. As the left and right retaining walls 90, 88 may be fixed with respect to the module housing 50, the force gauge 66 may have a second thickness 120 (e.g., along the Z axis 40, between the left retaining wall 90 and the plate 60) that is less than the first thickness 108. The second thickness 120 may correspond to a relatively large amount of swelling force.

Figure 9:
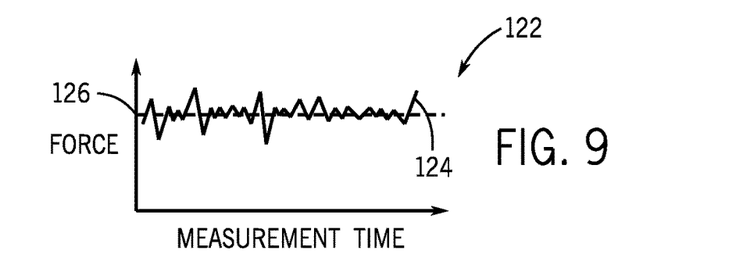
FIG. 9 is a chart of measured force for the battery module of FIG. 8, in accordance with the present disclosure.

FIG. 9 illustrates a chart 122 depicting measured force (e.g., by the force gauge 66) for the battery module 28 in the relatively late stage of life (e.g., as illustrated in FIG. 8). The chart 122 includes a second force curve 124 as a function of measurement time. Again, the measurement time may generally be shorter than the lifetime (e.g., months, or years) of the battery module 28, such as a few seconds, minutes, or hours. The measurement timing may be at or near any point of a battery cycle (e.g., a charge/discharge cycle), such as at a state of charge between approximately 100% and 10%, or between approximately 90% and 20%, or between approximately 80% and 30%, or between approximately 70% and 40%, or between approximately 60% and 50%. As a specific example, the force curve 124 may be collected when the battery module 28 is at approximately 10% of state of charge.

As illustrated, the second force curve 124 generally fluctuates about a second average force 126 during a period of measurement time. The second average force 126 may be larger than the first average force 114 because, as illustrated in FIG. 8, the battery cells 52 of the battery module 28 may exhibit swelling. Again, the fluctuations in the second force curve 124 may come from the force gauge 66 (e.g., standard deviations of the force measurement) and/or external vibrations (e.g., vibrations from the vehicle 10 in which the battery module 28 is placed), as discussed above. The fluctuations due to the external vibrations may be decoupled from the second force curve 124 before determining the second average force 126 using any suitable methods as described above.

Figure 10:
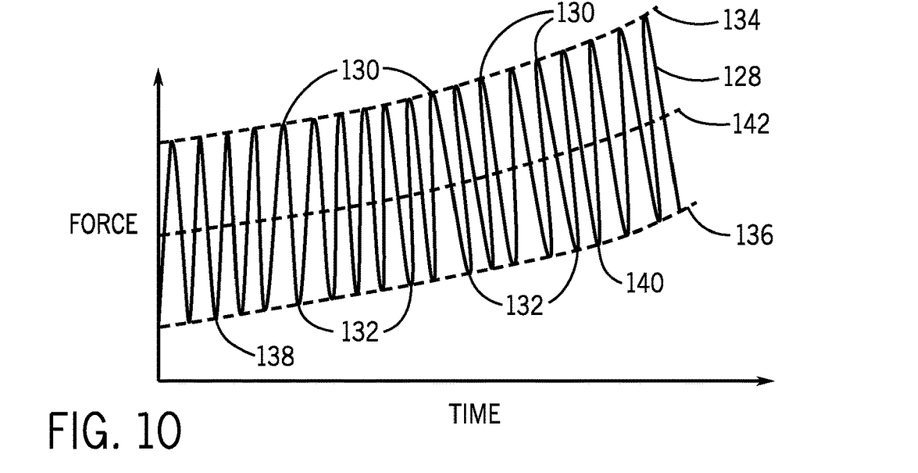
FIG. 10 is a chart of swelling force as a function of life time of a battery module, in accordance with the present disclosure.

FIG. 10 illustrates a relationship between the swelling force and a life time of the battery module 28. The swelling force, as illustrated in FIG. 10 by a curve 128, comes from the battery cells 52 (e.g., due to swelling of the electrodes 53 and/or gas generation of the electrolyte) and do not include sources such as external vibrations. In other words, the swelling force of FIG. 10 may come from decoupling of the force components due to the external vibrations from the measured force (e.g., via the force gauge 66).

As illustrated, the curve 128 may include a series of alternating peaks 130 and troughs 132. Each pair of peaks and troughs (maximum and minimum) on the time axis may represent a battery cycle (e.g., a charge/discharge cycle). As noted above, when the battery module 28 is being charged, the electrodes 53 of the battery cells 52 of the battery module 28 may swell to cause dimensional expansion of the battery cells 52 (e.g., the casings 49). As the casings 49 of the battery module 28 expands, the force gauge 66 coupled to the battery cells 52 (e.g., via the plate 60) may measure a force from the swelling. The swelling force may reach a maximum (e.g., one of the peaks 130 of the curve 128) in a battery cycle when the battery module 28 is nearly fully charged (e.g., at approximately 90% state of charge or a maximum state of charge at which the battery module 28 is operated). When the battery module 28 is discharging, the electrodes 53 of the battery cells 52 of the battery module 28 may reduce in size to cause dimensional contraction of the casings 49 of the battery cells 52. As the casings 49 of the battery cells 52 contract, the force gauge 66 coupled to the housing may measure a decreasing swelling force. The swelling force may reach a minimum (e.g., one of the troughs 132 of the curve 128) in a battery cycle when the battery module 28 is nearly fully discharged (e.g., at approximately 10% state of charge or a minimum state of charge at which the battery module 28 is operated). As such, when the battery module 28 experiences multiple battery cycles, the force curve 128 may include the series of alternating peaks 130 and troughs 132.

In addition, when the battery module 28 ages (e.g., experiencing more and more battery cycles), the swelling force may have a general trend of increase with respect to the life time (or number of battery cycles), for example, due to irreversible gas generation of the electrolyte, and/or de-lamination and permanent swelling of the electrodes 53. As illustrated, FIG. 10 includes a first curve 134 reflecting the change of the swelling force at the maximum state of change of battery cycles with respect to the life time of the battery module 28. Similarly, FIG. 10 also includes a second curve 136 reflecting the change of the swelling force at the minimum state of change of battery cycles with respect to the life time of the battery module 28. Both of the first curve 134 and the second curve 136 may have a generally increasing trend with respect to the life time of the battery module 28. The life time may be indicated by the real calendar time or the number of battery cycles.

As discussed above with respect to FIGS. 6-9, FIG. 6 may represent the battery module 28 at a nearly fully discharged state of charge (e.g., 10%) in a relatively early stage of life, and FIG. 9 may represent the battery module 28 at a nearly fully discharged state of charge (e.g., 10%) in a relatively late stage of life. As such, the state of the battery module 28 as illustrated in FIG. 6 may correspond to a first point 138 on the curve 128, and the state of the battery module 28 as illustrated in FIG. 8 may correspond to a second point 140 on the curve 128. The force value for the first point 138 may correspond to the first average force 114 as illustrated in FIG. 7, and the force value for the second point 140 may correspond to the second average force 126 as illustrated in FIG. 9.

While the first curve 134 and the second curve 136 illustrated examples of the relationship between the swelling force and the life time of the battery module 28, this relationship may generally be represented by any curve corresponding to the swelling force measured at any state of charge among the battery cycles. For example, FIG. 10 also includes a third curve 142 representing the relationship of the swelling force at approximately 50% state of charge in battery cycles with respect to the life time of the battery module 28. The third curve 142 also shows a generally increasing trend of the swelling force as a function of life time of the battery module 28.

In certain embodiments, a degree of change in the swelling force, in addition to or in lieu of the swelling force, may have a similar relationship to the life time of the battery module 28. For example, during a battery cycle (e.g., charge/discharge cycle, a degree of force change (e.g., represented by a percentage) from a reference state of charge (e.g., about 10%) to a measuring state of charge (e.g., about 50%) may correlate to the life time of the battery module 28.

Figure 11:
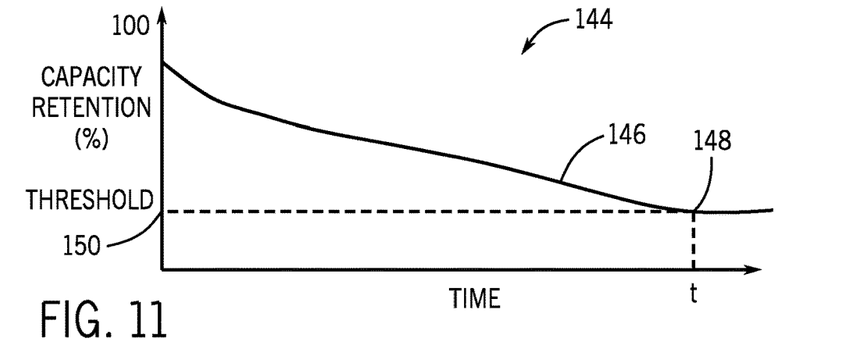
FIG. 11 is a chart of capacity retention as a function of life time of a battery module, in accordance with the present disclosure.

In accordance with the present disclosure, the swelling force (e.g., as measured by the force gauge 66) may be used to determine the state of health (e.g., the remaining usable life) of the battery module 28. FIG. 11 is a chart 144 illustrating a relationship between the capacity retention and the life time of the battery module 28. As illustrated, the chart 144 includes a curve 146 showing a change of capacity retention of the battery module as a function of life time. As used herein, the capacity retention is referred to as the fraction of full capacity available from a battery module under a specified set of conditions (e.g., temperature, C-rate, or the like), after the battery has been stored for a given amount of time. The capacity may be referred to as the total number of Ampere-hours that can be derived from a fully discharged battery module, under a specified set of conditions (e.g., temperature, C-rate, or the like).

As shown in FIG. 11, the capacity retention of the battery module 28 decreases as a function of the life time of the battery module 28. Again, the life time may be indicated by the real calendar time or the number of battery cycles. The capacity retention curve 146 may start with 100% (e.g., upon manufacturing). As the battery module 28 ages (e.g., experiencing more and more battery cycles), the capacity retention may decrease. The capacity retention curve 146 may include a point 148 corresponding to a threshold capacity retention 150 where the battery module 28 may be referred to having reached its total lifetime t. The threshold capacity retention 150 may depend at least on types (e.g., electrochemistry) and configurations (e.g., in series or in parallel) of the battery cells 52 of the battery module 28. In some embodiments, the threshold capacity retention 150 may correspond to a point on the curve 146 where the curve 146 starts to level off (e.g., as in a decay model).

The capacity retention as depicted in FIG. 11 may be considered to represent the state of health of the battery module 28. However, the state of health of the battery module 28 may be represented by any other suitable parameter, including, but not limited to, capacity, maximum Ampere-Hour, charging efficiency, impedance, or a combination thereof. It should also be noted that the capacity retention curve 146 (or any other similar curves indicating the state of health as a function of life time), as illustrated in FIG. 11, as well as the swelling force curve 128, as illustrated in FIG. 10, may be correlated to a specific type of the battery module 28. The type of the battery module 28 may be refer to one or a combination of features, including electrochemistry, number, electrical configuration, size, shape, or the like, of the battery cells 52 of the battery module 28. Thus, for the battery modules 28 having the same type, the battery modules 28 may have the same or similar capacity retention curves 146 and the swelling force curves 128. Accordingly, one set of the capacity retention curve 146 and the swelling force curve 128 may be obtained for one battery module 28 (or a group thereof) and used (e.g., as calibration curves) for any other battery modules 28 that are the same model.

Figure 12:
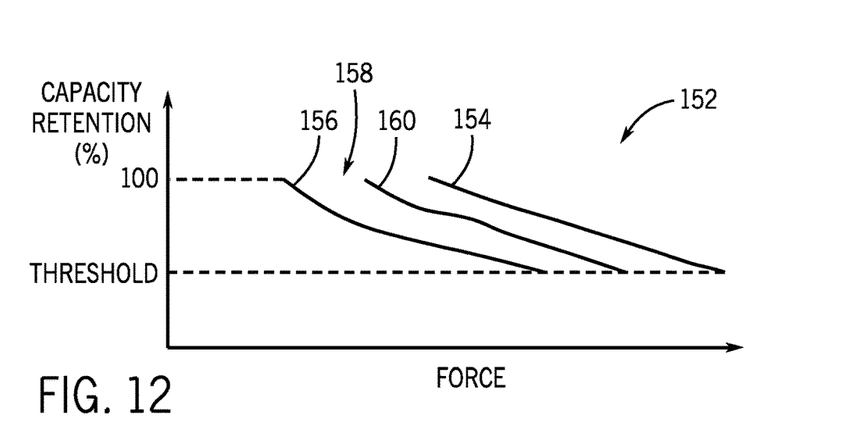
FIG. 12 is a chart of capacity retention as a function of swelling force of a battery module, in accordance with the present disclosure.

Capacity retention may also be correlated to the swelling force using the relationships described above. In this way, monitoring the swelling force enables monitoring of an estimation of state of health or remaining usable life of the battery module 28. For example, FIG. 12 illustrates a chart 152 of the capacity retention as a function of swelling force. As illustrated, the chart 152 includes a first curve 154 representing the capacity retention as a function of the swelling force at the maximum state of change of battery cycles of the battery module 28. In other words, the first curve 154 in FIG. 12 may be obtained based on the first curve 134 in FIG. 10 and the capacity retention curve 146 of FIG. 11. Similarly, the chart 152 includes a second curve 156 representing the capacity retention as a function of the swelling force at the minimum state of change of battery cycles of the battery module 28. In other words, the second curve 156 in FIG. 12 may be obtained based on the second curve 136 in FIG. 10 and the capacity retention curve 146 of FIG. 11. Further, in between the first curve 154 and the second curve 156 (e.g., an area 158) in FIG. 12, the chart 152 may include any curve representing the capacity retention as a function of the swelling force measured at any fixed state of charge among the battery cycles. As a specific example, the chart 152 includes a third curve 160 representing the capacity retention as a function of the swelling force at approximately 50% state of charge in battery cycles of the battery module 28. In other words, the third curve 160 in FIG. 12 may be obtained based on the third curve 142 in FIG. 10 and the capacity retention curve 146 of FIG. 11.

Using any of the curves (e.g., the first curve 153, the second curve 156, the third curve 160) of the chart 152, the state of health (e.g., life estimation) may be determined based on the swelling force. As discussed above, the measured force (e.g., by the force gauge 66) may be first processed to decouple the force components due to the external vibrations. The resulting force components may mainly correspond to the swelling force generated by the battery cells 52 of the battery module 28. Based on the resulting swelling force, and depending on the timing of the measurement of the swelling force (e.g., at a specific state of charge between approximately 100% and 10%, or between approximately 90% and 20%, or between approximately 80% and 30%, or between approximately 70% and 40%, or between approximately 60% and 50%), the capacity retention (or any other indicators of the state of health) of the battery module 28 may be obtained (e.g., from the first curve 154, the third curve 160, and the second curve 156, respectively).

The chart 152 as illustrated in FIG. 12 may be stored in the control module 32 (e.g., in the memory 36). In some embodiments, the chart 152 as illustrated in FIG. 12 may be converted to another format, such as a lookup table and/or a curve-fitting equation, and stored in the control module 32. As noted above, the swelling force generated by the battery cells 52 of the battery module 28 may be measured (e.g., in real time) by the force gauge 66 and the data corresponding to the force may be transmitted to and processed in the control module 32. Accordingly, the control module 32 may determine (e.g., in real time) the state of health (e.g., life estimation) of the battery module 28. In some embodiments, the control module 32 may provide a user-perceptible indication (e.g., a number, message, voice, alarm, or the like) of the state of health (e.g., the estimated remaining usable life) to a user (e.g., via the vehicle console 20). In other embodiments, separate processor and memory may be integrated with the battery module 28 and coupled to the force gauge 66. The separate processor and memory are configured to process and store all of the data as described above (e.g., as illustrated in FIGS. 10-12) for determining the state of health (e.g., the estimated remaining usable life) of the battery module 28 and/or providing a user-perceptible indication (e.g., a number, message, voice, alarm, or the like) of the state of health of the battery module 28.

Figure 13:
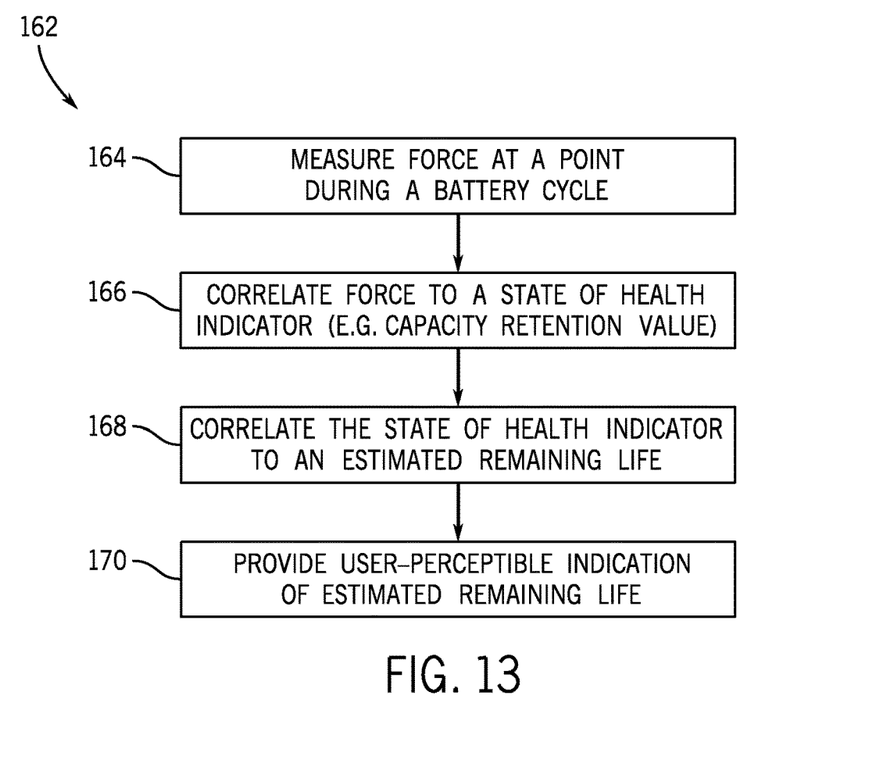
FIG. 13 is a flow diagram of a method for life estimation of a battery module, in accordance with the present disclosure.

FIG. 13 is a flow diagram of an embodiment of a method 162 for life estimation of the battery module 28 in accordance with the present disclosure. The method 162 may be performed by the components described above (e.g., the force gauge 66, the plate 60, and/or the retaining walls 88, 90). In the illustrated embodiment, the method 162 includes measuring a swelling force generated by the battery cells 52 of the battery module 28, via the force gauge 66, at a point during a battery cycle (block 164). The measurement point may be any time of the battery cycle, such as between approximately 100% and 10%, or between approximately 90% and 20%, or between approximately 80% and 30%, or between approximately 70% and 40%, or between approximately 60% and 50%. of the state of charge of the battery module 28. The measured force may be further processed to decouple the force components due to environmental conditions, such as temperature, vibrations, and so on. The resulting force may mainly come from the swelling force from the electrodes 53 of the battery cells 52 of the battery module 28.

The swelling force may then be correlated to a state of health indicator (block 166). For example, as discussed above, the capacity retention may be used as an indicator of the state of health of the battery module 28. The correlation of the state of health and the swelling force may be obtained as described above with respect to FIGS. 10-12. The state of health indicator (e.g., the capacity retention) may be further correlated with an estimated remaining usable life of the battery module 28 (block 168). For example, a 100% capacity retention may correspond to a "full life," and a 0% capacity retention may correspond to an end of useful life of the battery module 28. Any estimated remaining usable life of the battery module 28 may be represented by a percentage number between 100% and 0% (e.g., in a linear or any suitable relationship).

Once the remaining usable life of the battery module 28 is determined, a user-perceptible indication of the estimated remaining usable life may be provided (block 170). As discussed above, the indication may include a number, message, voice, alarm, or any combination thereof. Also, the indication may be provided to the user via any suitable device or interface, such as a display integrated with the battery module 28, and the vehicle console 20.

One or more of the disclosed embodiments, alone or on combination, may provide one or more technical effects including estimating the state of health, for example, the remaining usable life, of a battery module by measuring a swelling force generated by the battery module. A force-measuring device may be mechanically coupled externally to a casing of the battery module to measure the swelling force collectively generated by one or more battery cells of the battery module. The system and method disclosed herein may be applicable to a wide variety of battery cells, including various types and configurations of lithium ion battery cell chemistries, may be easily integrated with existing battery control modules, and may not necessarily involve modification of design of individual battery cells. The technical effects and technical problems in the specification are exemplary and are not limiting. It should be noted that the embodiments described in the specification may have other technical effects and can solve other technical problems.

While only certain features and embodiments have been illustrated and described, many modifications and changes may occur to those skilled in the art (e.g., variations in sizes, dimensions, structures, shapes and proportions of the various elements, values of parameters (e.g., temperatures, pressures, etc.), mounting arrangements, use of materials, colors, orientations, etc.) without materially departing from the novel teachings and advantages of the subject matter. The order or sequence of any process or method steps may be varied or re-sequenced according to alternative embodiments. It is, therefore, to be understood that the appended claims are intended to cover all such modifications and changes as fall within the true spirit of the invention. Furthermore, in an effort to provide a concise description of the exemplary embodiments, all features of an actual implementation may not have been described. It should be appreciated that in the development of any such actual implementation, as in any engineering or design project, numerous implementation specific decisions may be made. Such a development effort might be complex and time consuming, but would nevertheless be a routine undertaking of design, fabrication, and manufacture for those of ordinary skill having the benefit of this disclosure, without undue experimentation.

The invention claimed is:

1. A battery module, comprising:
a housing;
a cell stack disposed in the housing and comprising multiple lithium ion battery cells;
a force gauge in mechanical communication with the cell stack and configured to measure a force generated by a swelling of the cell stack;
a control module comprising a processor programmed to receive data indicative of the force and to estimate a remaining usable life of the battery module based on the data; and
wherein the force gauge is further configured to measure a second force generated by vibrations of the battery module, and the processor is further programmed to filter data indicative of the second force from the data indicative of the force generated by the swelling of the cell stack.

2. The battery module of claim 1, comprising a plate in abutment with the cell stack, wherein the force gauge is coupled to the plate, and wherein the plate is compressed externally against an end of the cell stack, and the force gauge is disposed on the plate and between the plate and the housing of the battery module.

3. The battery module of claim 2, wherein the cell stack comprises two retaining walls disposed at two respective ends of the cell stack and configured to retain the cell stack, and the plate is disposed between the cell stack and one of the retaining walls.

4. The battery module of claim 2, wherein the cell stack comprises multiple battery cells, and the plate is disposed between two of the multiple battery cells, and the force gauge is disposed on the plate and between the plate and one of the two of the multiple battery cells.

5. The battery module of claim 1, wherein the force gauge is disposed on a face of the battery cell of the cell stack.

6. The battery module of claim 1, wherein the force gauge is positioned externally relative to a casing of the battery cell and configured to measure the force along a direction of the swelling of the cell stack.

7. The battery module of claim 1, wherein the force gauge comprises a force transducer.

8. The battery module of claim 1, wherein the battery cell is a prismatic battery cell.

9. The battery module of claim 1, wherein the force gauge is configured to measure a second force generated by vibrations of the battery module, and the processor is programmed to decouple data indicative of the second force from the data indicative of the force generated by the swelling of the cell stack.

10. The battery module of claim 1, wherein the processor is programmed to estimate the remaining usable life of the battery module based on a relationship between the force generated by the swelling of the cell stack and a parameter correlated to the remaining usable life of the battery module.

11. The battery module of claim 10, wherein the parameter comprises a capacity retention, a capacity, a maximum Ampere-Hour, a charging efficiency, an impedance, or any combination thereof, of the battery module.

12. The battery module of claim 1, wherein the force gauge is configured to measure the force generated by the swelling of the cell stack between approximately 10% and 90% state of charge of the battery module.

13. A lithium ion battery module, comprising:
a housing;
a plurality of lithium ion battery cells disposed in the housing, wherein the plurality of lithium ion battery cells are arranged in a cell stack;
a force gauge mechanically coupled to the plurality of lithium ion battery cells and configured to measure an overall measured force having a first force generated by a swelling of the cell stack and a second force generated by vibrations of the battery module; and
a control module communicatively coupled to the force gauge, to decouple the second force from the overall measured force, and comprising a processor programmed to determine a state of charge, to acquire data indicative of the first force and to estimate a remaining usable life of the lithium ion battery module based on the data.

14. The lithium ion battery module of claim 13, comprising a plate mechanically coupled to the cell stack and the force gauge, wherein the plate is compressed externally against an end of the cell stack, and the force gauge is disposed on the plate and between the plate and the housing of the battery module.

15. The lithium ion battery module of claim 14, wherein the cell stack comprises multiple lithium ion battery cells, the plate is disposed between two of the multiple lithium ion battery cells, and the force gauge is disposed on the plate and between the plate and one of the two of the multiple lithium ion battery cells.

16. The lithium ion battery module of claim 13, wherein the force gauge is positioned externally relative to a casing of each of the lithium ion battery cell and configured to measure the force along a direction of the swelling of the cell stack.

17. The lithium ion battery module of claim 13, wherein the force gauge comprises a force transducer.

18. The lithium ion battery module of claim 13, wherein the plurality of lithium ion battery cells are prismatic battery cells.

19. The lithium ion battery module of claim 13, wherein the force gauge is configured to measure a second force generated by vibrations of the lithium ion battery module, and the control module is configured to decouple data indicative of the second force from the data indicative of the force generated by the swelling of the cell stack.

20. The lithium ion battery module of claim 13, wherein the processor is programmed to estimate the remaining usable life of the battery module based on a relationship between the force generated by the swelling of the cell stack and a parameter correlated to the remaining usable life of the lithium ion battery module, wherein the parameter comprises a capacity retention, a capacity, a maximum Ampere-Hour, a charging efficiency, an impedance, or any combination thereof, of the lithium ion battery module.

* * * * *